(12) United States Patent
Wakabayashi et al.

(10) Patent No.: US 7,592,672 B2
(45) Date of Patent: Sep. 22, 2009

(54) GROUNDING STRUCTURE OF SEMICONDUCTOR DEVICE INCLUDING A CONDUCTIVE PASTE

(75) Inventors: Takeshi Wakabayashi, Sayama (JP); Ichiro Mihara, Tachikawa (JP); Osamu Okada, Hamura (JP)

(73) Assignee: Casio Computer Co., Ltd., Tokyo (JP)

( * ) Notice: Subject to any disclaimer, the term of this patent is extended or adjusted under 35 U.S.C. 154(b) by 78 days.

(21) Appl. No.: 11/729,650

(22) Filed: Mar. 29, 2007

(65) Prior Publication Data
US 2007/0228468 A1 Oct. 4, 2007

(30) Foreign Application Priority Data
Mar. 30, 2006 (JP) .............................. 2006-093178

(51) Int. Cl.
*H01L 29/04* (2006.01)
(52) U.S. Cl. .............................. 257/347; 257/E27.112; 257/E21.32
(58) Field of Classification Search ................. 257/503, 257/687–707, 728–730, 347, E27.112, E21.32, 257/365
See application file for complete search history.

(56) References Cited

U.S. PATENT DOCUMENTS

| | | | | |
|---|---|---|---|---|
| 5,311,059 A | * | 5/1994 | Banerji et al. ................ | 257/778 |
| 6,191,360 B1 | * | 2/2001 | Tao et al. ..................... | 174/522 |
| 6,500,699 B1 | * | 12/2002 | Birdsley et al. ............. | 438/121 |
| 6,657,312 B2 | * | 12/2003 | Hirano ........................ | 257/780 |
| 6,713,878 B2 | * | 3/2004 | Goetschalckx ............... | 257/778 |
| 6,939,738 B2 | * | 9/2005 | Nakatani et al. ............ | 438/108 |

FOREIGN PATENT DOCUMENTS

JP 2003-218356 A 7/2003

* cited by examiner

*Primary Examiner*—Thao P. Le
(74) *Attorney, Agent, or Firm*—Frishauf, Holtz, Goodman & Chick, P.C.

(57) ABSTRACT

A circuit substrate of a grounding structure of a semiconductor device according to the invention has a plurality of connection pads and a grounding wiring. The semiconductor device has a semiconductor substrate having one side face and the other side face opposite thereto, an insulating film formed thereon, an SOI integrated circuit provided thereon and including a plurality of connection pads, and electrodes for external connection each of which is connected to the corresponding connection pad. The semiconductor device has the external connection electrodes connected to the respective connection pads of the circuit substrate by a face-down bonding scheme. An under-filling material is provided between the semiconductor device and the circuit substrate, and there is provided a connection member which connects the other side face of the semiconductor device with the grounding wiring of the circuit substrate, and is made of a conductive material.

14 Claims, 8 Drawing Sheets

GROUNDING STRUCTURE OF SEMICONDUCTOR DEVICE INCLUDING A CONDUCTIVE PASTE

BACKGROUND OF THE INVENTION

1. Field of the Invention

The present invention relates to the grounding structure of a semiconductor device.

2. Description of the Related Art

An SOI (Silicon On Insulator) type semiconductor device has an insulating film like a silicon oxide formed on a semiconductor substrate, and an integrated circuit formed thereon. According to this structure, the integrated circuit including thin film transistors is surely insulated from the semiconductor substrate, thereby facilitating complete inter-device isolation and reducing various parasitic capacitances, resulting in sufficient suppression of degrading of the device characteristics. This makes it possible to suppress latch up which is peculiar to CMOS-transistor circuits. Accordingly, speeding-up of an integrated circuit with low voltage operation is facilitated, and the reliability thereof is improved.

Unexamined Japanese Patent Application KOKAI Publication No. 2003-218356 discloses such a structure that an SOI type semiconductor device is bonded on a circuit substrate. The package of the semiconductor device disclosed in this publication has the SOI type semiconductor device on a lead frame by a face-up scheme, i.e., with an integrated circuit being faced up, and each connection pad of the integrated circuit is connected to the lead frame by wire bonding. According to this semiconductor package, a conductive adhesion layer fixes the semiconductor device to the lead frame, and the lead frame is grounded, thereby stabilizing the electric potential of the semiconductor device.

SUMMARY OF THE INVENTION

According to the foregoing conventional semiconductor device package, however, when the integration degree of the integrated circuit becomes high, it is necessary to enlarge the pitch of the bonding positions of bonding wires at the lead frame to prevent shortening of the bonding wires. Therefore, the length of each bonding wire is lengthened, and the resistance thereof becomes large, so that it becomes a problem for speeding-up of the device. Moreover, the mounting area becomes large, and this is not suitable for miniaturization.

Therefore, it is an object of the invention to provide a grounding structure of a semiconductor device which is advantageous to speeding-up and can reduce the mounting area.

A circuit substrate of a grounding structure of a semiconductor device according to the invention has a plurality of connection pads and a grounding wiring. The semiconductor device includes a semiconductor substrate having one side face and the other side face opposite thereto, an insulating film formed on the one side face of the semiconductor substrate, an SOI integrated circuit provided thereon and including a plurality of connection pads, and electrodes for external connection each of which is connected to the corresponding connection pad of the SOI integrated circuit. The semiconductor device has the external connection electrodes connected to the respective connection pads of the circuit substrate by a face-down bonding scheme. An under-filling material is provided between the semiconductor device and the circuit substrate, and there is provided a connection member which connects the other side face of the semiconductor device with the grounding wiring of the circuit substrate, and is made of a conductive material.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

First Embodiment

Figure 1:
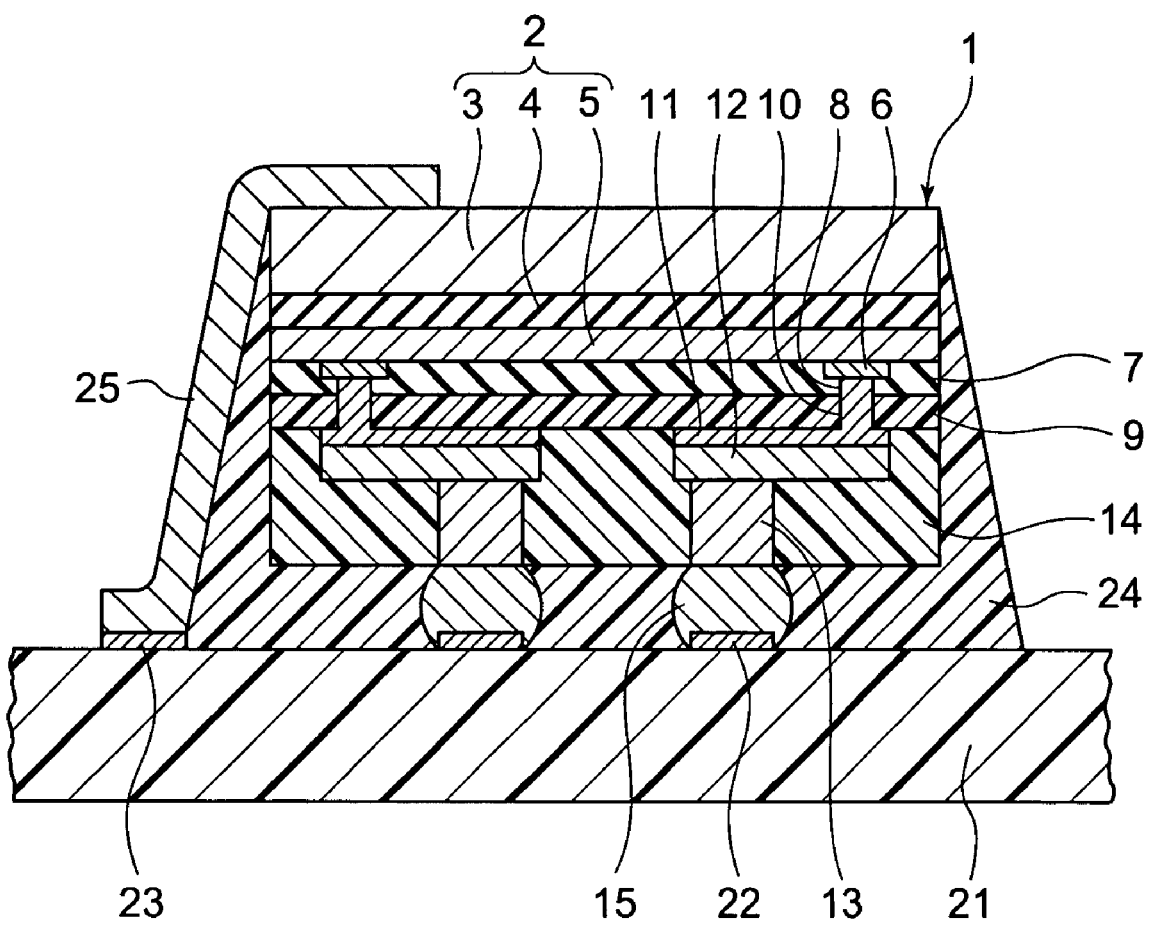
FIG. 1 is a cross-sectional view showing a grounding structure of a semiconductor device according to a first embodiment of the invention.
Figure 2:
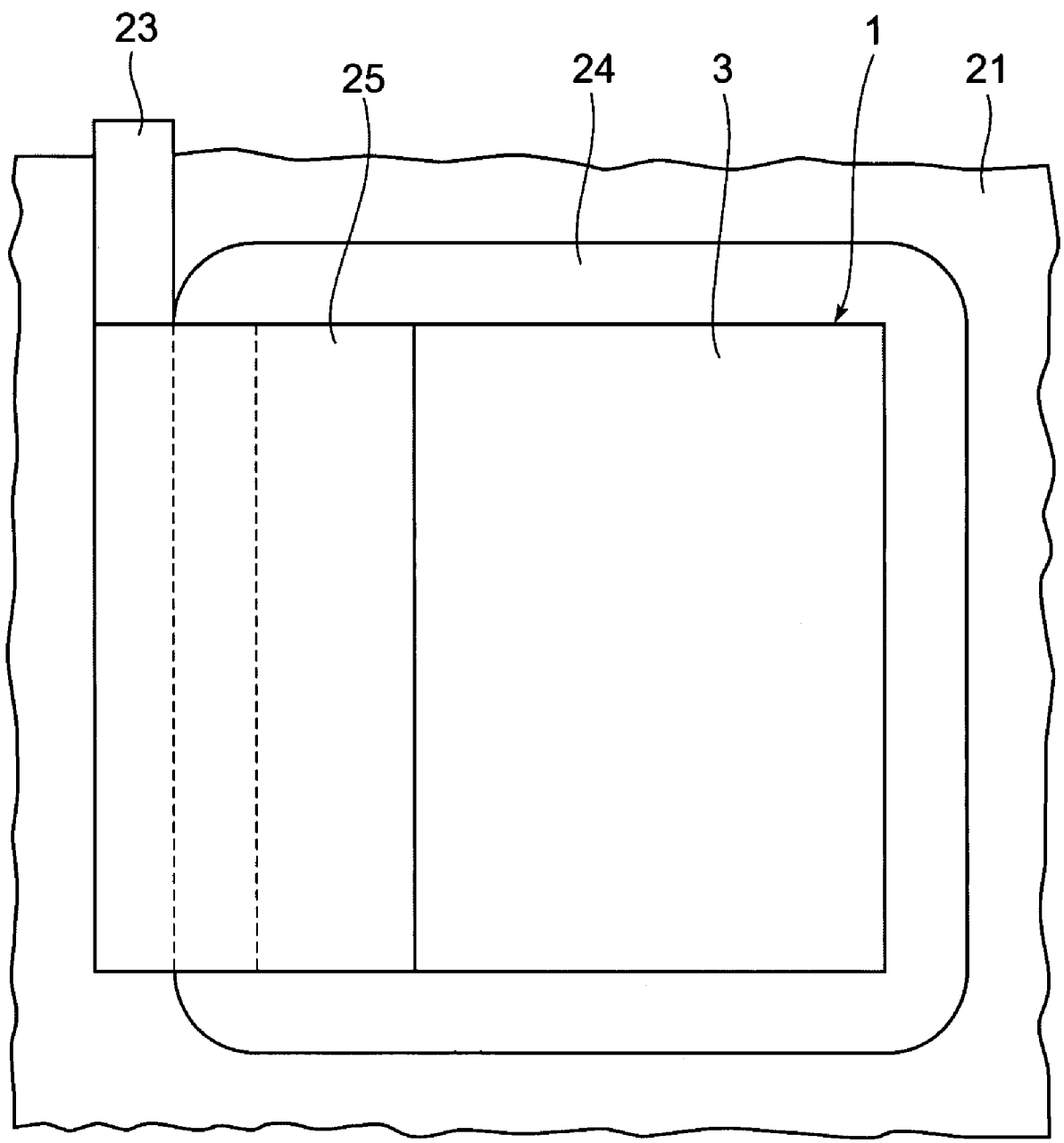
FIG. 2 is a schematic top plan view showing the grounding structure of the semiconductor device shown in FIG. 1 with the part of the grounding structure being omitted.

FIG. 1 is a cross-sectional view showing a grounding structure of a semiconductor device according to the first embodiment of the invention, and FIG. 2 is a schematic top plan view showing the grounding structure thereof. A semiconductor device 1 is one which is so-called CSP (Chip Size Package), and has an SOI substrate 2.

The SOI substrate 2 is structured in such a way that the bottom face of a silicon substrate (semiconductor substrate) 3 having a plane formed in a square shape is provided with an insulating film 4 like silicon oxide, and the bottom face of the insulating film 4 is provided with an SOI integrated circuit 5 formed by a thin film transistor. In this case, the source and drain regions of the thin film transistor in the SOI integrated circuit 5 are connected to the silicon substrate 3 through vertical conduction portions (not shown) provided in the insulating film 4.

A plurality of connection pads 6 each made of aluminum-based metal or the like are provided at the periphery of the bottom face of the SOI integrated circuit 5 in such a manner as to be connected thereto. An insulating film 7 made of silicon oxide or the like is provided below the SOI integrated circuit 5 except the central portions of the bottom faces of the connection pads 6, and the central portion of the bottom face of each connection pad 6 is exposed through an opening 8 formed in the insulating film 7.

A protective film (insulating film) 9 made of a polyimide-based resin or the like is provided below the insulating film 7.

Openings 10 are formed in portions of the protective film 9 corresponding to the openings 8 of the insulating film 7. Underlaying metallic layers 11 each made of copper or the like are provided below the protective film 9. Wirings 12 each made of copper are provided at the respective entire bottom faces of the underlaying metallic layers 11. One end side of each wiring 12 including the underlaying metallic layer 11 is connected to the connection pad 6 through the openings 10, 8 of the protective film 9 and the insulating film 7, respectively.

The connection-pad portion of the bottom face of the wiring 12 is provided with a cylindrical electrode (electrode for external connection) 13. A sealing film 14 made of an epoxy-based resin is provided below the protective film 9 including the wirings 12 in such a way that the bottom face thereof forms the same plane with the bottom faces of the cylindrical electrodes 13. A soldering ball 15 is provided at the bottom face of each cylindrical electrode 13. The plurality of soldering balls 15 are disposed in a matrix pattern below the sealing film 14.

A plurality of connection pads 22 each having a plane formed in a circular shape are provided at the top face of a circuit substrate 21 in the matrix pattern. Each connection pad 22 is connected to one end of a wiring (not shown) formed at the top face of the circuit substrate 21. A grounding wiring 23 is provided at a predetermined portion in the top face of the circuit substrate 21.

The soldering balls 15 are connected to the respective connection pads 22, so that the semiconductor device 1 is mounted on the circuit substrate 21 by a face-down scheme. An under-filling material made of an epoxy-based resin or the like is provided between the semiconductor device 1 and the circuit substrate 21. In this case, the under-filling material 24 is provided in such a manner as to cover the top face of the circuit substrate 21 around the semiconductor device 1 and the peripheral side faces of the semiconductor device 1.

One end portion of the grounding wiring 23 on the circuit substrate 21 is disposed outward the under-filling material 24 at a portion along a side of the semiconductor device 1. A connection member 25 which is fixed to the under-filling material 14 is provided on the entire top face of the one end portion of the silicon substrate 3 of the semiconductor device 1, the outer face of the under-filling material 24 in the vicinity thereof, and the top face of the grounding wiring 23 near the under-filling material 24 by applying a conductive paste like a silver paste using a dispenser, and causing it to harden.

As explained above, according to the grounding structure of the semiconductor device of the embodiment, the insulating film 7 and the protective film 9 are provided below the SOI integrated circuit 5 including the connection pads 6, the wirings 12 including the underlaying metallic layers 11 which are connected to the respective connection pads 6 are provided below the protective film 9, the cylindrical electrodes 13 are provided below the respective connection pad portions of the wirings 12, the sealing film 14 is provided below the protective film 9 including the wirings 12, the soldering balls 15 provided below the respective cylindrical electrodes 13, and the soldering balls 15 are connected to the respective connection pads 22 disposed below those balls and on the circuit substrate 21. Accordingly, the electrical connection wiring in this case can be formed in the thickness direction, so that the mounting area can be reduced. The semiconductor device 1 is bonded on the circuit substrate 21 by a face-down or flip chip scheme, and the distance between the connection pad 6 of the semiconductor device 1 and the connection pad 22 of the circuit substrate 22 is short, so that the grounding structure is advantageous to speeding-up.

Moreover, according to the grounding structure of the semiconductor device, the under-filling material 24 is provided between the semiconductor device 1 and the circuit substrate 21, and provided in such a manner as to cover the top face of the circuit substrate 21 around the semiconductor device 1 and the peripheral side faces of the semiconductor device 1. Therefore, it is possible to reduce the protruding length of the under-filling material 24 which protrudes outward the peripheral side faces of the semiconductor device 1 as much as possible. Because the connection member 25 is provided on the entire top face of one side portion of the silicon substrate 3 of the semiconductor device 1, the outer face of the under-filling material 24 in the vicinity thereof, and the top face of the grounding wiring 23 near the under-filling material 24, the protruding length of the connection member 25 which protrudes outward the under-filling material 24 can be reduced as much as possible. As a result, the substantive mounting area of the semiconductor device 1 can be reduced in comparison with conventional structures which use bonding wirings.

Second Embodiment

Figure 3:
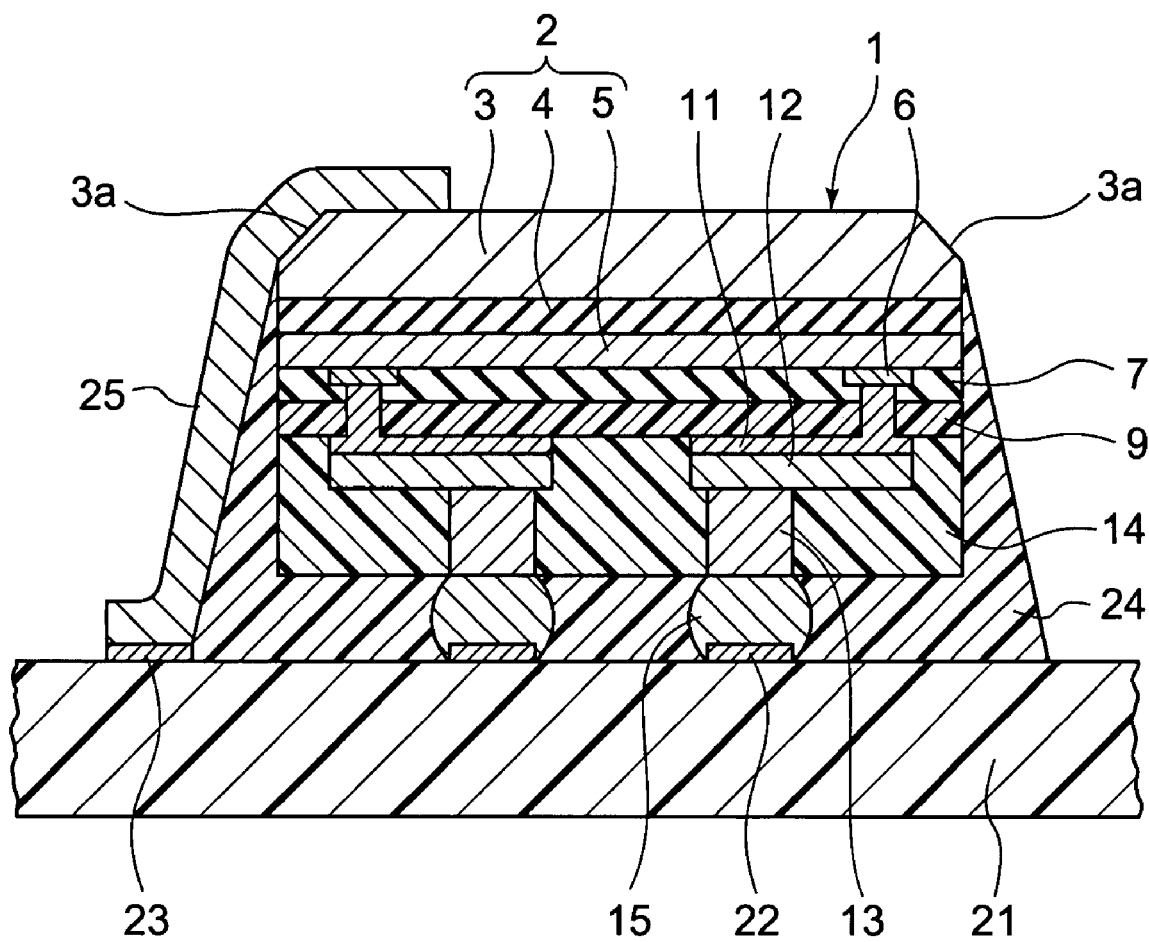
FIG. 3 is a cross-sectional view showing a grounding structure of a semiconductor device according to a second embodiment of the invention.

FIG. 3 is a cross-sectional view showing a grounding structure of a semiconductor device according to the second embodiment. The difference of the grounding structure of the semiconductor device from one shown in FIG. 1 is that an inclined face 3a is provided at the peripheral portion of the top face of the silicon substrate 3 of the semiconductor device 1. This makes it possible to not only reduce the substantive mounting area of the semiconductor device 1 in comparison with the conventional structure using bonding wirings, but also make the connection member 25, which is so provided as to cover the inclined face 3a of the silicon substrate 3 and portions in the vicinity thereof, not easily broken.

Next, an explanation will be given of a part of fabrication method of the semiconductor device 1 according to the second embodiment. First, the insulating film 4, the SOI integrated circuit 5, the connection pads 6, the insulating film 7, the protective film 9, the wirings 12 including the underlaying metallic layers 11, the cylindrical electrodes 13, the sealing film 14 and the soldering balls 15 are formed below the silicon substrate 3 in a wafer state. Next, a groove (inclined face 3a) formed in almost letter V like shape is formed in the top face of the silicon substrate 3 in a wafer state along a dicing street in such a manner as to be wider than the dicing street. Subsequently, cutting along the dicing street is performed to obtain the plurality of semiconductor devices 1 each shown in FIG. 3. In this case, depending on the width of the dicing street, but it is preferable that the angle of the inclined face 3a should be 45 degree or so.

Third Embodiment

Figure 4:
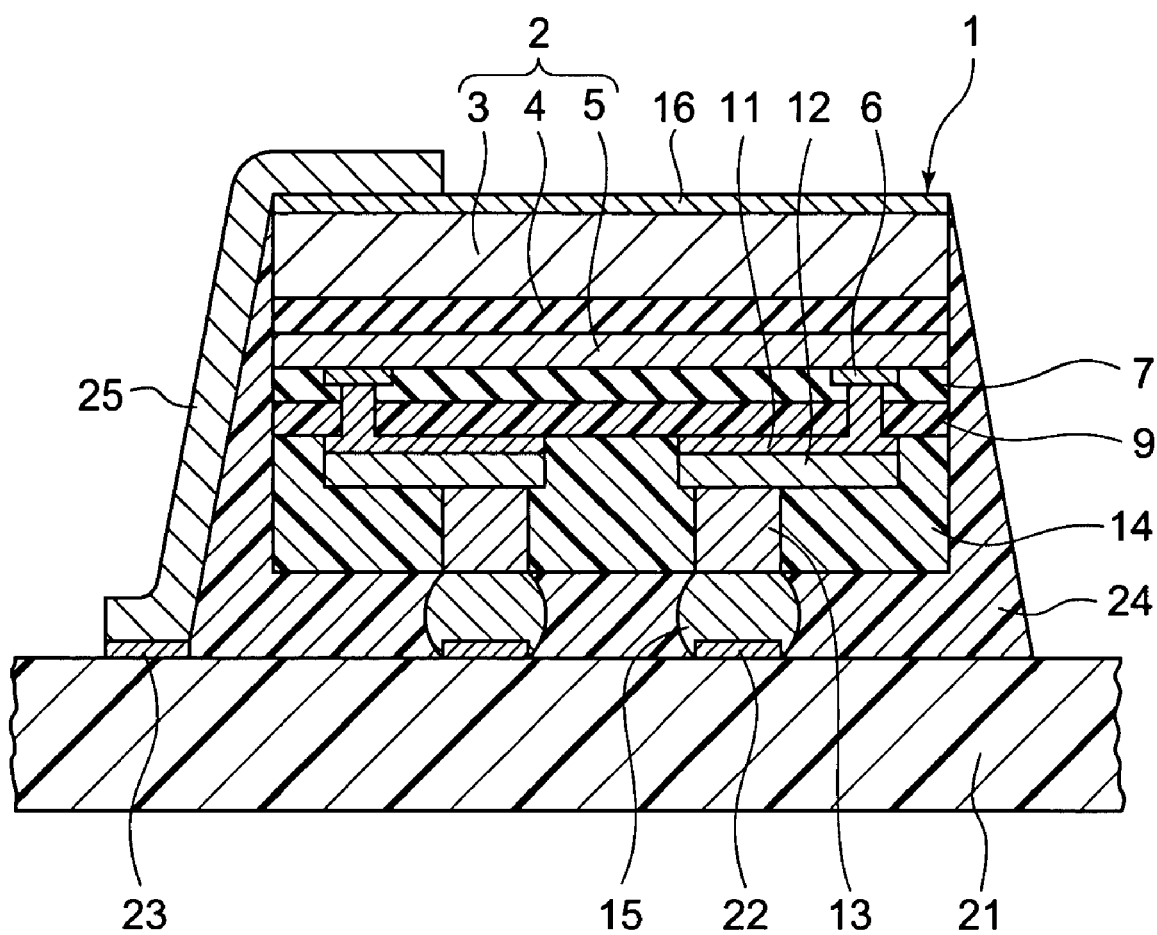
FIG. 4 is a cross-sectional view showing a grounding structure of a semiconductor device according to third embodiment of the invention.

FIG. 4 is a cross-sectional view showing a grounding structure of a semiconductor device according to the third embodiment of the invention. The difference from the first embodiment shown in FIG. 1 is that a metallic film 16 made of copper, nickel, or the like is provided at the entire top face of the silicon substrate 3, and the one end portion of the connection member 25 is provided at a predetermined portion in the upper face of the metallic film 16. This reduces the substantial mounting area of the semiconductor device 1 in comparison with the conventional structures using bonding wirings.

Like the structure shown in FIG. 3, the inclined face 3a may be formed in the side face of the silicon substrate 3 in this embodiment. In this case, a groove (inclined face 3a) formed in almost letter V like shape may be formed in the top face of the silicon substrate 3 in a wafer state along a dicing street in such a manner as to be wider than the dicing street, a metal film may be deposited on the top face of the silicon substrate 3 including the groove formed in almost letter V like shape by sputtering or the like, and then cutting is performed along the dicing street.

A conductive film made of a conductive paste, anisotropic conductive adhesive, or the like may be formed instead of the metallic film 16.

Fourth Embodiment

Figure 5:
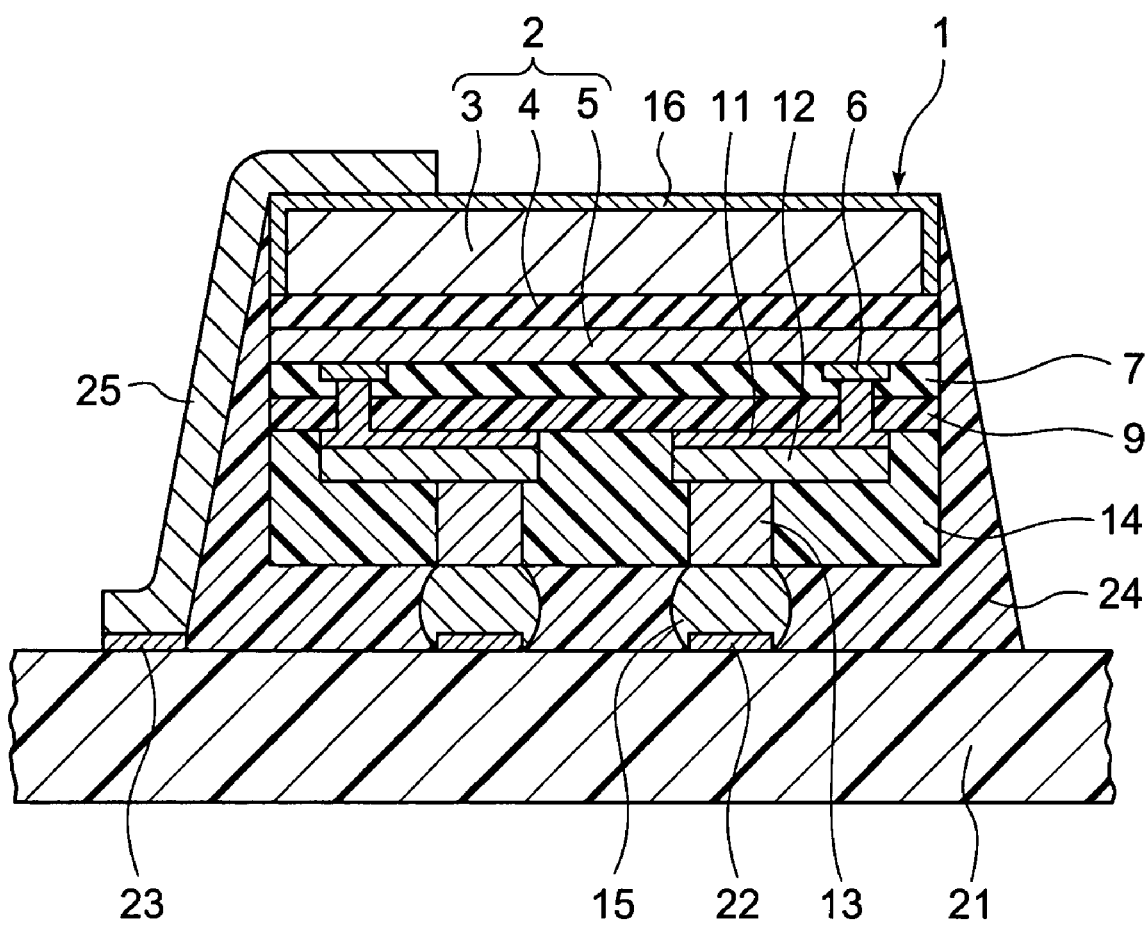
FIG. 5 is a cross-sectional view showing a grounding structure of a semiconductor device according to a fourth embodiment of the invention.

FIG. 5 is a cross-sectional view showing a grounding structure of a semiconductor device according to the fourth embodiment of the invention. The difference of the grounding structure of this semiconductor device from one shown in FIG. 4 is that the metallic film 16 is provided on the top and peripheral side faces of the silicon substrate 3 of the semiconductor device 1.

Next, an explanation will be given of a part of the fabrication method of the semiconductor device 1 according to the fourth embodiment. First, the insulating film 4, the SOI integrated circuit 5, the connection pads 6, the insulating film 7, the protective film 9, the wirings 12 including the underlaying metallic layers 11, the cylindrical electrodes 13 and the sealing film 14 are formed below the silicon substrate 3 in a wafer state. Next, a groove is formed in the top face of the silicon substrate 3 in the wafer state along a dicing street in such a manner as to be wider than the dicing street. Subsequently, the metallic film 16 is deposited on the top face of the silicon substrate 3 in the wafer state including the groove, and then the soldering balls 15 are formed below the cylindrical electrodes 13. Thereafter, cutting is performed along the dicing street, thereby obtaining the plurality of semiconductor devices 1 shown in FIG. 5.

In the embodiment, the inclined face 3a may be provided at the side face of the silicon substrate 3 as shown in FIG. 3, and may be provided only at the metallic film 16. A conductive film made of a conductive paste, anisotropic conductive adhesive or the like may be formed instead of the metallic film 16. Further, the conductive film may be formed on only the peripheral side faces of the silicon substrate 3. In this case, when the conductive film made of a conductive paste, anisotropic conductive adhesive or the like is formed only in a groove formed in the top face of the silicon substrate 3 in a wafer state along a dicing street, a semiconductor device having the conductive film formed on only the peripheral side faces of the silicon substrate 3 can be obtained.

Fifth Embodiment

Figure 6:
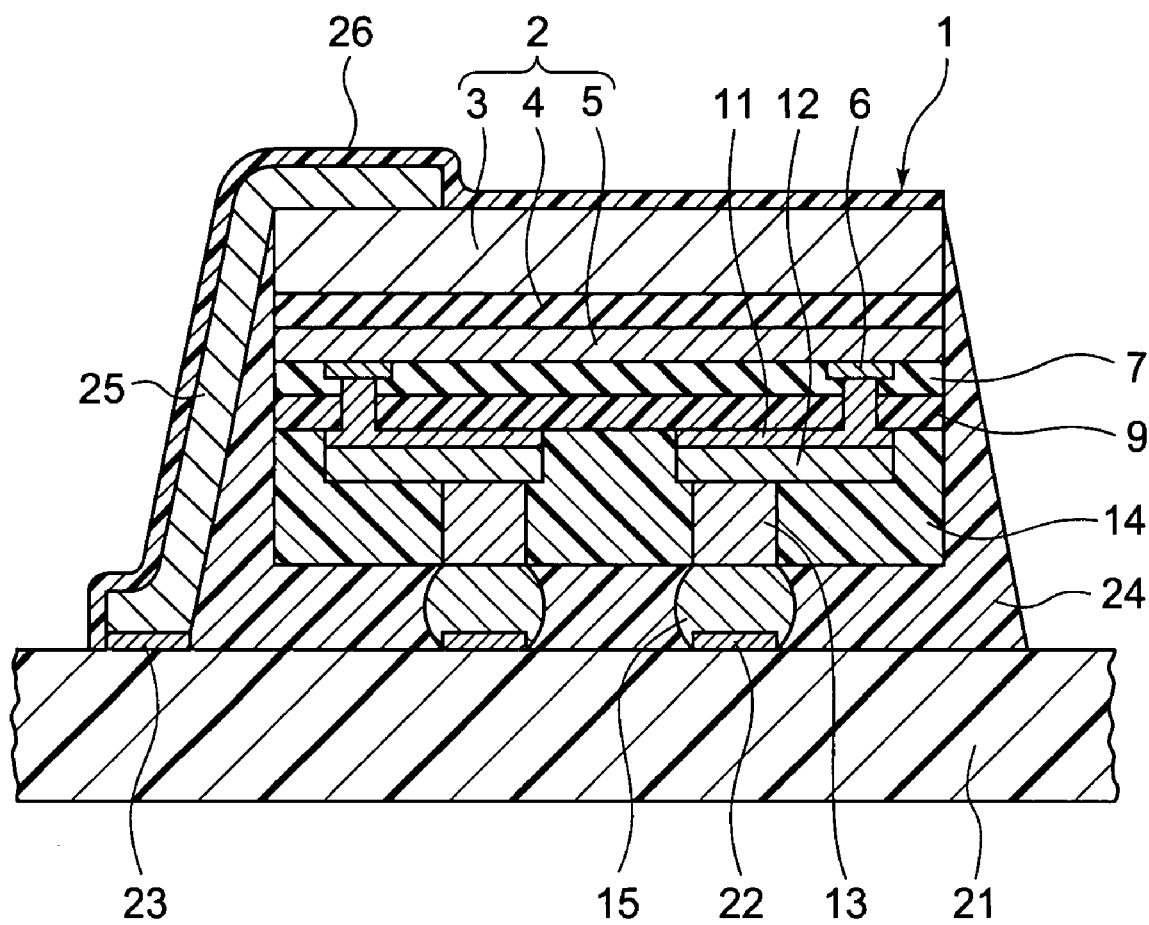
FIG. 6 is a cross-sectional view showing a grounding structure of a semiconductor device according to a fifth embodiment of the invention.

FIG. 6 is a cross-sectional view showing a grounding structure of a semiconductor device according to the fifth embodiment. The difference of the grounding structure of this semiconductor device from that of the first embodiment shown in FIG. 1 is that an insulating film 26 made of, for example, an epoxy-based resin is formed on the top face of the silicon substrate 3, the surface of the connection member 25, and the one side face of the grounding wiring 23. In the case of the grounding structures shown in FIGS. 4 and 5, the insulating film 26 made of an epoxy-based resin may be formed on the top face of the metallic film 16 (conductive film), the surface of the connection member 25, and the one side face of the grounding wiring 23. Materials other than an epoxy-based resin may be used as long as they have an insulation property.

Sixth Embodiment

Figure 7:
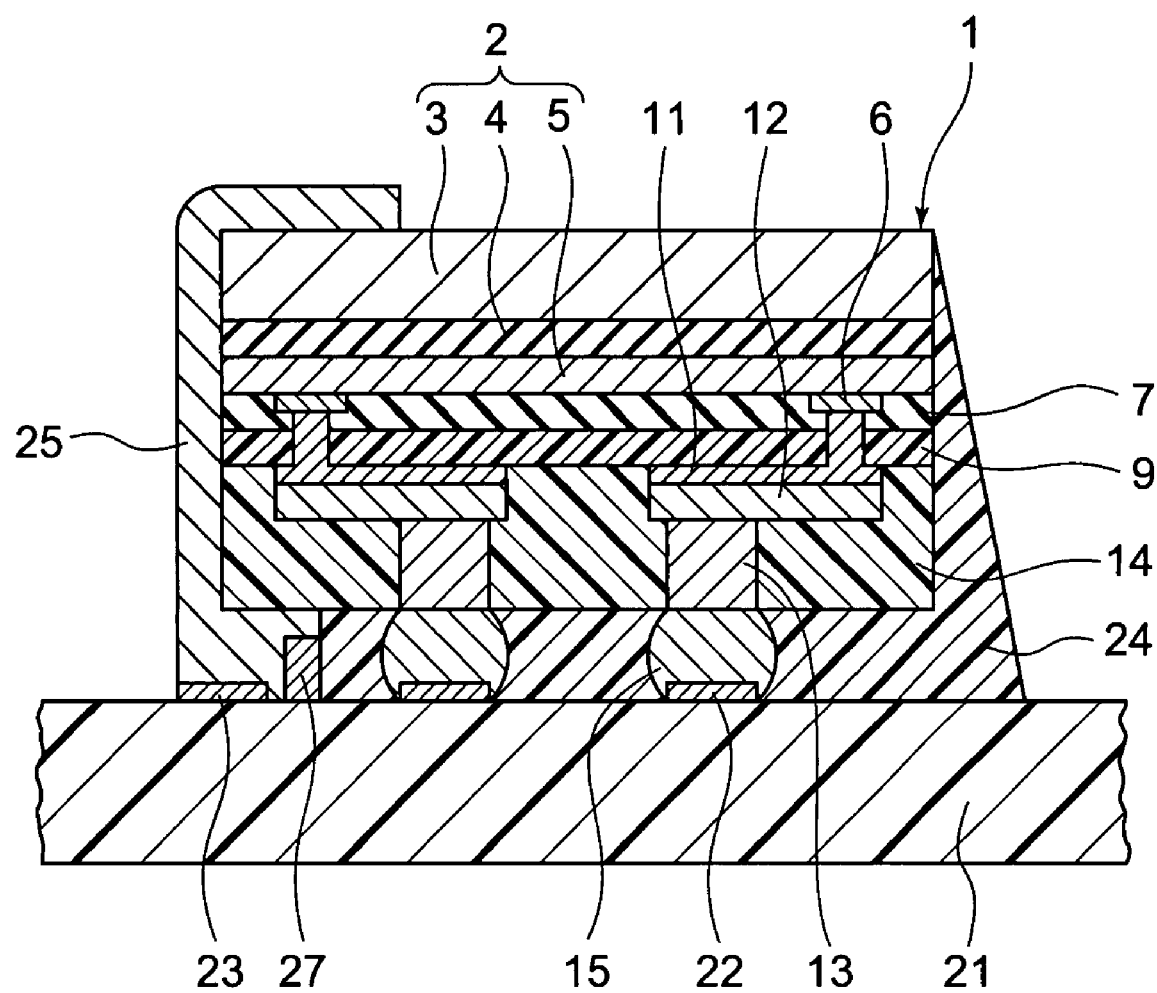
FIG. 7 is a cross-sectional view showing a grounding structure of a semiconductor device according to a sixth embodiment of the invention.

FIG. 7 is a cross-sectional view showing a grounding structure of a semiconductor device according to the sixth embodiment of the invention. The difference of the grounding structure of this semiconductor device from that of the first embodiment shown in FIG. 1 is that the grounding wiring 23 is disposed below one side of the semiconductor device 1, and the connection member 25 is provided on the entire top face of the one end portion of the silicon substrate 3 of the semiconductor device 1, the entire one-side side face of the semiconductor device 1, and the top face of the grounding wiring 23 in the vicinity thereof. In this case, an under-filling-material stopping member 27 is provided at a predetermined portion of the top face of the circuit substrate 21 inward the grounding wiring 23.

Next, an explanation will be given of a method of forming the under-filling material 24 according to the sixth embodiment. First, the semiconductor device 1 is mounted on the circuit substrate 21 by a face-down scheme. Next, using a dispenser, the under-filling material 24 is filled between the semiconductor device 1 and the circuit substrate 21 from a direction opposite to the place where the grounding wiring 23 is disposed. In this case, the under-filling material 24 filled between the semiconductor device 1 and the circuit substrate 21 is stopped by the under-filling-material stopping member 27, so that it does not flow over the top face of the grounding wiring 23.

According to the sixth embodiment, the grounding wiring 23 is disposed under the one side of the semiconductor device 1, and the connection member 25 is provided on the entire top face of the one side portion of the silicon substrate 3 of the semiconductor device 1, the entire one-side side face of the semiconductor device 1, and the top face of the grounding wiring 23 in the vicinity thereof, thereby further reducing the substantial mounting area of the semiconductor device 1 in comparison with the embodiment shown in FIG. 1.

Seventh Embodiment

Figure 8:
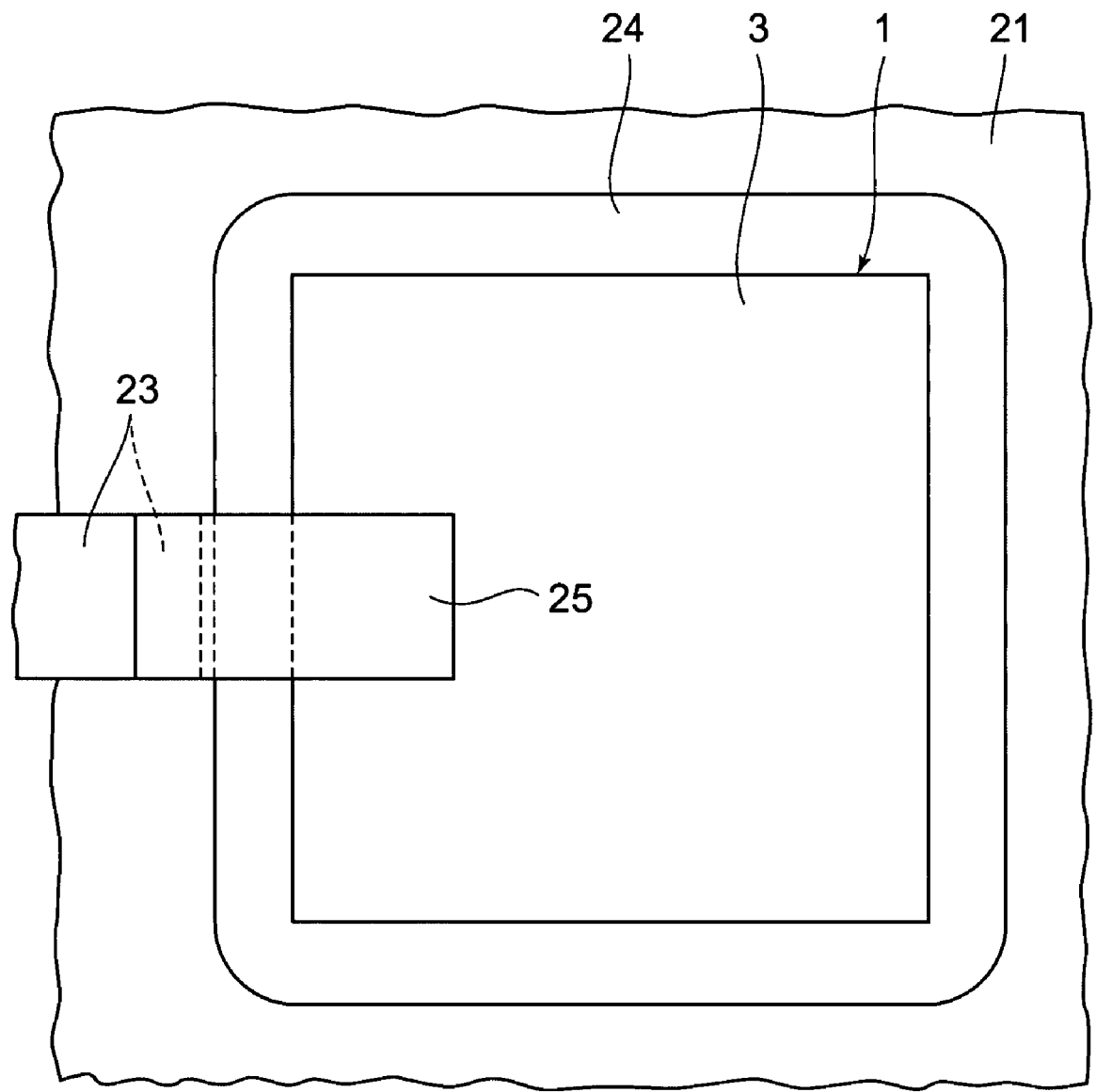
FIG. 8 is a schematic top plan view showing a grounding structure of a semiconductor device according to a seventh embodiment of the invention with the part of the grounding structure being omitted like FIG. 2.

FIG. 8 is a schematic top plan view showing a grounding structure of a semiconductor device according to the seventh embodiment with a part of the grounding structure being omitted like FIG. 2. The difference of the grounding structure of this semiconductor device from the grounding structure shown in FIG. 2 is that the one end portion of the grounding wiring 23 is disposed at a peripheral location which is orthogonal to the one side of the semiconductor device 1 and away from the under-filling material 24, and the connection member 25 is provided on a part of one side of the top face of the silicon substrate 3 of the semiconductor device 1, the outer face of the under-filling material 24 in the vicinity thereof, and the top face of the grounding wiring 23 in the vicinity of the under-filling material 24.

Other Embodiments

For example, in the first embodiment shown in FIG. 1, to prevent the breakage of the connection member 25 because of the edge of the silicon substrate 3 of the semiconductor device 1, the connection member 25 may be formed by a scheme of spraying a conductive paste using a screw piston, which is so-called jet dispenser scheme. Actual hardening of the under-filling material 24 and that of the connection member 25 made of a conductive paste may be performed separately, and the under-filling material 24 may be hardened in a tacked manner beforehand, and then actually hardened together with the connection member 25.

The explanation has been given of the case where the connection member 25 which connects the silicon substrate 3 of the semiconductor device 1 with the grounding wiring 23 is generally constituted of a conductive paste in the foregoing embodiments, but conductive pastes may be provided on only the silicon substrate 3 and the grounding wiring 23, and connected together by a connection member having a metallic foil like a copper foil, or a resin film formed on the bottom face of the metallic foil.

Connection may be achieved by a connection member with an anisotropic conductive adhesive which covers one surface of a metallic foil and has conductive fillers in an insulating material. In this case, it is preferable that the connection member having the metallic foil should employ a structure so as to have an adhesive on a region thereof other than the connection portion of the metallic foil, and to be bonded to the under-filling material 24.

As explained above, according to the present invention, the semiconductor device having the semiconductor substrate, the insulating films and the SOI integrated circuit is mounted on the circuit substrate by a face-down scheme, the under-filling material is provided between the semiconductor device and the circuit substrate, and the grounding wiring provided on the circuit substrate outward the under-filling material and the semiconductor substrate of the semiconductor device are connected together by the connection member made of a conductive paste or a metallic foil. Therefore, the mounting area can be reduced in comparison with the conventional structures using bonding wirings.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2006-93178 filed on Mar. 30, 2006 and including specification, claims, drawings and summary. The disclosure of the above Japanese Patent Application is incorporated herein by reference in its entirety.

What is claimed is:

1. A semiconductor device grounding structure comprising:
a circuit substrate having a plurality of connection pads and a grounding wiring;
a semiconductor device including a semiconductor substrate which has a first face and a second face opposite thereto, and a first side surface and a second side surface opposite thereto, wherein an insulating film is formed on the first face of the semiconductor substrate, an SOI integrated circuit including a plurality of connection pads is provided on the insulating film, and electrodes for external connection are connected to the connection pads of the SOI integrated circuit, respectively, the electrodes for external connection being connected to the connection pads of the circuit substrate, respectively, by a face-down bonding scheme;
an under-filling material provided between the semiconductor device and the circuit substrate; and
a conductive paste which connects the second face of the semiconductor substrate with the grounding wiring of the circuit substrate along only one of the first and second side surfaces of the semiconductor substrate; and
wherein the conductive paste is fixed to the second face of the semiconductor substrate, said one of the first and second side surfaces of the semiconductor substrate, and the grounding wiring of the circuit substrate.

2. The grounding structure of a semiconductor device according to claim 1, wherein a metallic foil is provided on the second face of the semiconductor substrate.

3. The grounding structure of a semiconductor device according to claim 1, wherein the under-filling material has a side end portion which covers a part of at least a peripheral side face of the semiconductor device, and wherein the conductive paste is fixed to the side end portion of the under-filling material.

4. The grounding structure of a semiconductor device according to claim 3, wherein the under-filling material has an inclined face which becomes larger at a peripheral portion of the semiconductor device in a direction from the second face of the semiconductor substrate toward the circuit substrate.

5. The grounding structure of a semiconductor device according to claim 1, wherein the grounding wiring has an end portion which is located inside the semiconductor device inward toward a peripheral side face of the semiconductor device, and wherein the conductive paste has a portion which is joined together with the end portion of the grounding wiring.

6. The grounding structure of a semiconductor device according to claim 5, wherein an under-filling-material stopping member is provided inward of the end portion of the grounding wiring of the circuit substrate.

7. The grounding structure of a semiconductor device according to claim 1, wherein an insulating film is provided on the second face of the semiconductor substrate and a surface of one end portion of the conductive paste connected to the second face of the semiconductor substrate.

8. The grounding structure of a semiconductor device according to claim 1, wherein a conductive film is provided on the second face of the semiconductor substrate of the semiconductor device, and one end portion of the conductive paste is provided so as to cover at least a part of the conductive film.

9. The grounding structure of a semiconductor device according to claim 8, wherein the conductive film has a peripheral end portion extending to at least one of the first and second faces of the semiconductor substrate.

10. The grounding structure of a semiconductor device according to claim 8, wherein an insulating film is provided on an upper face of the conductive film facing the semiconductor substrate, and a surface of the conductive paste.

11. The grounding structure of a semiconductor device according to claim 1, wherein an inclined face is provided at a peripheral portion of an upper face opposing a lower face facing the SOI integrated circuit of the semiconductor substrate of the semiconductor device.

12. The grounding structure of a semiconductor device according to claim 1, wherein the semiconductor device has a plurality of soldering balls provided below the SOI integrated circuit, and connected thereto, and each of the soldering balls is connected to the connection pad provided on the circuit substrate.

13. A grounding structure of a semiconductor device comprising:
a circuit substrate having a plurality of connection pads and a grounding wiring;
a semiconductor device including:
(i) an SOI substrate having a semiconductor substrate which has a first face, a second face opposite thereto, and a plurality of surfaces which are provided between said first face and said second face, wherein an insulating film is formed on the first face of semiconductor substrate, and wherein an SOI integrated circuit including a plurality of connection pads is provided on the insulating film, (ii) electrodes for external connection formed on the SOI substrate, each electrode being connected to a corresponding connection pad of the SOI integrated circuit, and (iii) a sealing film formed between the electrodes for external connection on the SOI substrate;

a bonding member which electrically bonds the electrodes for external connection of the semiconductor device with the connection pads of the circuit substrate, respectively;

an under-filling material provided between the semiconductor device and the circuit substrate; and a conductive paste which connects the second face of the semiconductor substrate with the grounding wiring of the circuit substrate along only one of the first and second side surfaces of the semiconductor substrate;

wherein the conductive paste comprises portions adhered to the second face of the semiconductor substrate and the under-filling material.

14. A grounding structure of a semiconductor device comprising:

a circuit substrate having a plurality of connection pads and a grounding wiring;

a semiconductor device including:

(i) an SOI substrate having a semiconductor substrate which has first face, a second face opposite thereto, and a plurality of side surfaces which are provided between said first side face and said second side face, wherein an insulating film is formed on the first face of the semiconductor substrate, and wherein an SOI integrated circuit including a plurality of connection pads is provided on the insulating film, (ii) electrodes for external connection formed on the SOI substrate, each electrode being connected to a corresponding connection pad of the SOI integrated circuit, and (iii) a sealing film formed between the electrodes for external connection on the SOI substrate;

a bonding member which electrically bonds the electrodes for external connection of the semiconductor device with the connection pads of the circuit substrate, respectively;

an under-filling material provided between the semiconductor device and the circuit substrate, and having an inclined portion which covers at least a peripheral side end of the semiconductor device and becomes large at a peripheral portion of the semiconductor device from the second face of the semiconductor substrate toward the circuit substrate; and a conductive paste which connects the second face of the semiconductor substrate with the grounding wiring of the circuit substrate along only one of the first and second side surfaces of the semiconductor substrate;

wherein the conductive paste comprises portions adhered to the second face of the semiconductor substrate and the under-filling material.

* * * * *